(12) United States Patent
Ogawa et al.

(10) Patent No.: US 9,449,838 B2
(45) Date of Patent: *Sep. 20, 2016

(54) SEMICONDUCTOR DEVICE MANUFACTURING METHOD

(71) Applicant: TOKYO ELECTRON LIMITED, Tokyo (JP)

(72) Inventors: Kazuto Ogawa, Tokyo (JP); Kazuki Narishige, Miyagi (JP); Takanori Sato, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/695,825

(22) Filed: Apr. 24, 2015

(65) Prior Publication Data

US 2015/0228500 A1  Aug. 13, 2015

Related U.S. Application Data

(63) Continuation of application No. 14/447,881, filed on Jul. 31, 2014, now Pat. No. 9,039,913.

(30) Foreign Application Priority Data

Jul. 31, 2013 (JP) .................. 2013-159005
Feb. 5, 2014 (JP) .................. 2014-020626

(51) Int. Cl.
| | | |
|---|---|---|
| *B44C 1/22* | (2006.01) | |
| *C23F 1/00* | (2006.01) | |
| *C23F 3/00* | (2006.01) | |
| *H01L 21/311* | (2006.01) | |
| *H01J 37/32* | (2006.01) | |
| *H01L 21/033* | (2006.01) | |

(52) U.S. Cl.
CPC .... *H01L 21/31116* (2013.01); *H01J 37/32091* (2013.01); *H01L 21/0332* (2013.01); *H01L 21/31144* (2013.01)

(58) Field of Classification Search
CPC ........... H01L 21/3065; H01L 21/3211; H01L 21/31116
USPC ..................................... 216/79, 72
See application file for complete search history.

(56) References Cited

U.S. PATENT DOCUMENTS

2006/0252269 A1* 11/2006 Panda ............... H01L 21/31116
                                                      438/706
2013/0059450 A1    3/2013 Le Gouil et al.

* cited by examiner

*Primary Examiner* — Roberts Culbert
(74) *Attorney, Agent, or Firm* — Rothwell, Figg, Ernst, Manbeck, P.C.

(57) ABSTRACT

In a semiconductor device manufacturing method, a target object including a multilayer film and a mask formed on the multilayer film is prepared in a processing chamber of a plasma processing apparatus. The multilayer film is formed by alternately stacking a silicon oxide film and a silicon nitride film. The multilayer film is etched by supplying a processing gas containing hydrogen gas, hydrogen bromide gas, nitrogen trifluoride gas and at least one of hydrocarbon gas, fluorohydrocarbon gas and fluorocarbon gas into the processing chamber of the plasma processing apparatus and generating a plasma of the processing gas in the processing chamber.

11 Claims, 7 Drawing Sheets

SEMICONDUCTOR DEVICE MANUFACTURING METHOD

CROSS-REFERENCES TO RELATED APPLICATIONS

This application claims the benefit of priority of each of the following applications and describes the relationship of the earlier applications. The present application is a Continuation application of and claims the benefit of priority from U.S. application Ser. No. 14/447,881, filed Jul. 31, 2014. The present application is further based upon and claims the benefit of priority from the prior Japanese Patent Application Nos. 2013-159005, filed Jul. 31, 2013 and 2014-020626, filed Feb. 5, 2014. The entire contents of foregoing applications are incorporated herein by reference.

FIELD OF THE INVENTION

An embodiment of the present invention relates to a semiconductor device manufacturing method.

BACKGROUND OF THE INVENTION

As an example of a semiconductor device, there is known a NAND-type flash memory device having a 3D structure. In the manufacture of the NAND-type flash memory device having a 3D structure, a multilayer film, which is formed by stacking two layers having different dielectric constant alternately, is etched to form a deep hole in the multilayer film. Such etching is disclosed in U.S. Patent Application Publication No. 2013/0059450.

Specifically, referring to U.S. Patent Application publication No. 2013/0059450, the multilayer film is etched by exposing a target object having an amorphous carbon mask on the multilayer film to a plasma of a processing gas including $CH_2F_2$ gas, $N_2$ gas and $NF_3$ gas. Further, U.S. Patent Application Publication No. 2013/0059450 discloses a method for ramping down a pressure in a chamber during etching.

In the case of forming a deep hole in an etching target film by etching the multilayer film described above, the shape of the mask needs to be maintained until the etching is completed. In other words, a mask selectivity is required. However, the shape of the mask may not be maintained against the plasma of the processing gas disclosed in U.S. Patent Application Publication No. 2013/0059450.

SUMMARY OF THE INVENTION

Accordingly, there is a need to improve a mask selectivity in the case of etching for forming a shape such as a deep hole.

In accordance with an aspect, there is provided a semiconductor device manufacturing method which includes the steps of: (a) preparing, in a processing chamber of a plasma processing apparatus, a target object including a multilayer film and a mask formed on the multilayer film, the multilayer film being formed by alternately stacking a first and a second dielectric film having different dielectric constant, and (b) etching the multilayer film by supplying a processing gas containing hydrogen gas, hydrogen bromide gas; nitrogen trifluoride gas and at least one of hydrocarbon gas, fluorohydrocarbon gas and fluorocarbon gas into the processing chamber of the plasma processing apparatus and generating a plasma of the processing gas in the processing chamber.

The processing gas used in the step (b) of the manufacturing method particularly contains carbon and hydrogen. The processing gas contains a relatively large amount of hydrogen atoms. Therefore, a protective film containing carbon and having a high hardness is formed on the surface of the mask during the etching in the step (b). As a result, the shape of the mask can be maintained until the etching is completed. In other words, the mask selectivity can be improved in etching for forming a shape with a large depth in the multilayer film.

The plasma processing apparatus may be a capacitively coupled plasma processing apparatus. Further, in the step (b) of etching the multilayer film, an RF power for plasma generation may be applied to an upper electrode or a lower electrode of the plasma processing apparatus, and an RF bias power may be applied to the lower electrode of the plasma processing apparatus. In addition, the first dielectric film may be a silicon oxide film, and the second dielectric film may be a silicon nitride film. The mask may be made of amorphous carbon or an organic polymer.

The temperature of the target object may be changed during the step (b). When the temperature of the target object is low, the etching rate of the multilayer film is high and, thus, a width of the shape with a large depth, e.g., a diameter of a hole, formed in the multilayer film becomes large. On the other hand, when a temperature of the target object is high, the etching rate of the multilayer film is low but a thick protective film can be formed. Therefore, it is possible to form a shape, e.g., a hole, having a small width as a whole, the width being gradually smaller toward the bottom in a depth direction. Accordingly, a shape having a high verticality and a small width can be formed by changing the temperature of the target object during the step (b).

In the step (b), a temperature of the target object in a first period may be set to be higher than a temperature of the target object in a second period following the first period. In other words, the temperature of the target object in the first period of the step (b) may be set to a relatively high level, and the temperature of the target objet in the second period of the step (b) may be set to a relatively low level. With such, it is possible to form, in the first period, a shape having a width that becomes gradually smaller toward the bottom in the depth direction and also possible to form a thick protective film on a surface defining the shape. Further, the width of the shape at the bottom can be increased in the second period. Accordingly, it is possible to form a shape, e.g., a hole, having a small width and a high verticality.

Alternatively, in the step (b), a temperature of the target object in the first period may be set to be lower than a temperature of the target object in the second period following the first period. In other words, the temperature of the target object may be set to a relatively low level in the first period of the step (b), and the temperature of the target object may be set to a relatively high level in the second period of the step (b). Accordingly, a high etching rate can be ensured in the first period, and a shape, e.g., a hole, with a small width, can be formed in the second period.

As described above, in accordance with the aspect of the present invention, a mask selectivity can be improved in etching for forming a shape with a large depth in the multilayer film.

BRIEF DESCRIPTION OF THE DRAWINGS

The objects and features of the present invention will become apparent from the following description of embodiments, given in conjunction with the accompanying drawings, in which.

DETAILED DESCRIPTION OF THE EMBODIMENTS

Figure 1:
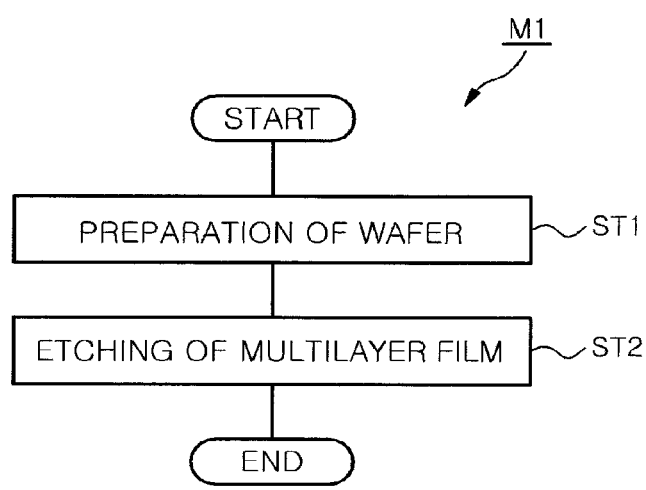
FIG. 1 is a flowchart showing a semiconductor device manufacturing method in accordance with an embodiment of the present invention.

Hereinafter, embodiments of the present invention will be described with reference to the accompanying drawings. Meanwhile, like reference numerals will be used for like or corresponding parts in all the drawings.

FIG. 1 is a flowchart showing a semiconductor device manufacturing method in accordance with an embodiment of the present invention. The semiconductor device manufacturing method MT shown in FIG. 1 includes steps ST1 and ST2 and may be used for manufacturing a NAND flash memory having a 3D structure, for example. In the step ST1, a target objet (hereinafter, referred to as "wafer") W is prepared. In the step ST2, a multilayer film of the wafer W is etched.

Figure 2:
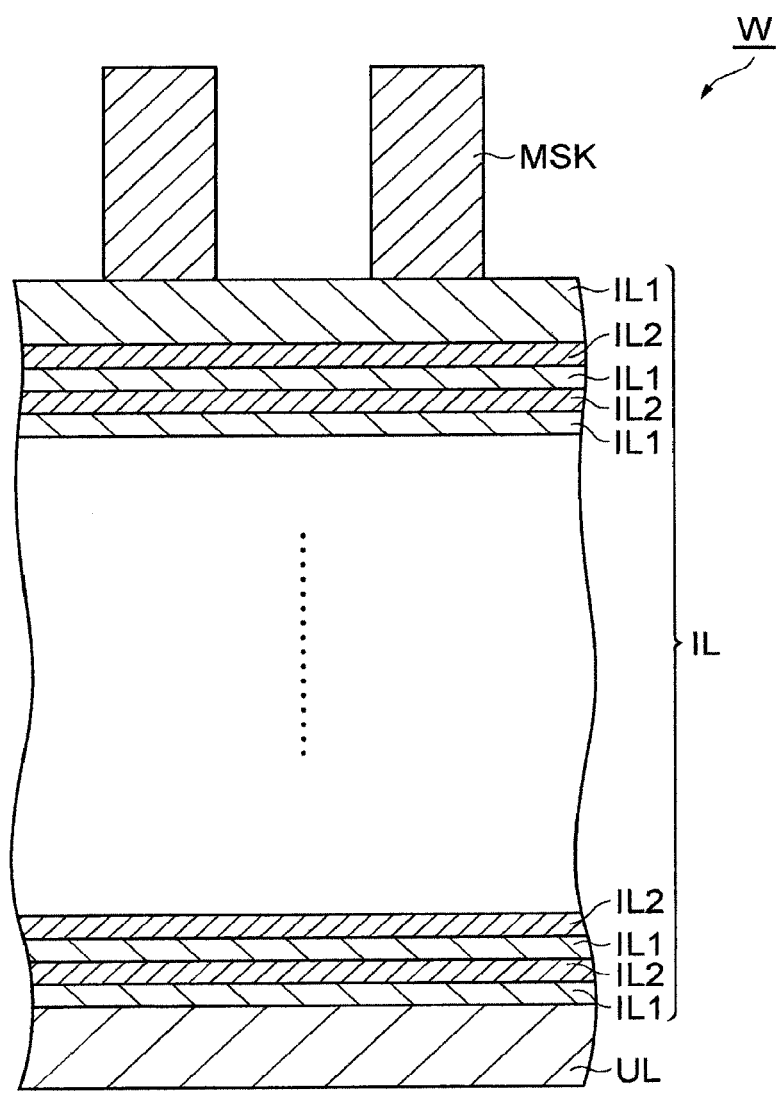
FIG. 2 shows an example of a wafer prepared in a step ST1.

FIG. 2 shows an example of a wafer prepared in the step ST1. The wafer W shown in FIG. 2 includes a base layer UL, a multilayer film IL, and a mask MSK. The base layer UL may be a polycrystalline silicon layer formed on a substrate. The multilayer film IL is formed on the base layer UL. The multilayer film IL has a structure in which two dielectric films IL1 and IL2 having different dielectric constants are alternately stacked. In the present embodiment, the dielectric film IL1 is a silicon oxide film, and the dielectric film IL2 is a silicon nitride film. The dielectric film IL1 has a thickness of, e.g., 5 nm to 50 nm. The dielectric film IL2 has a thickness of, e.g., 10 nm to 75 nm. The mask MSK is formed on the multilayer film IL. The mask MSK has a pattern for forming a shape, such as a hole, with a large depth on the multilayer film IL. The mask MSK may be made of, e.g., amorphous carbon or an organic polymer.

Figure 3:
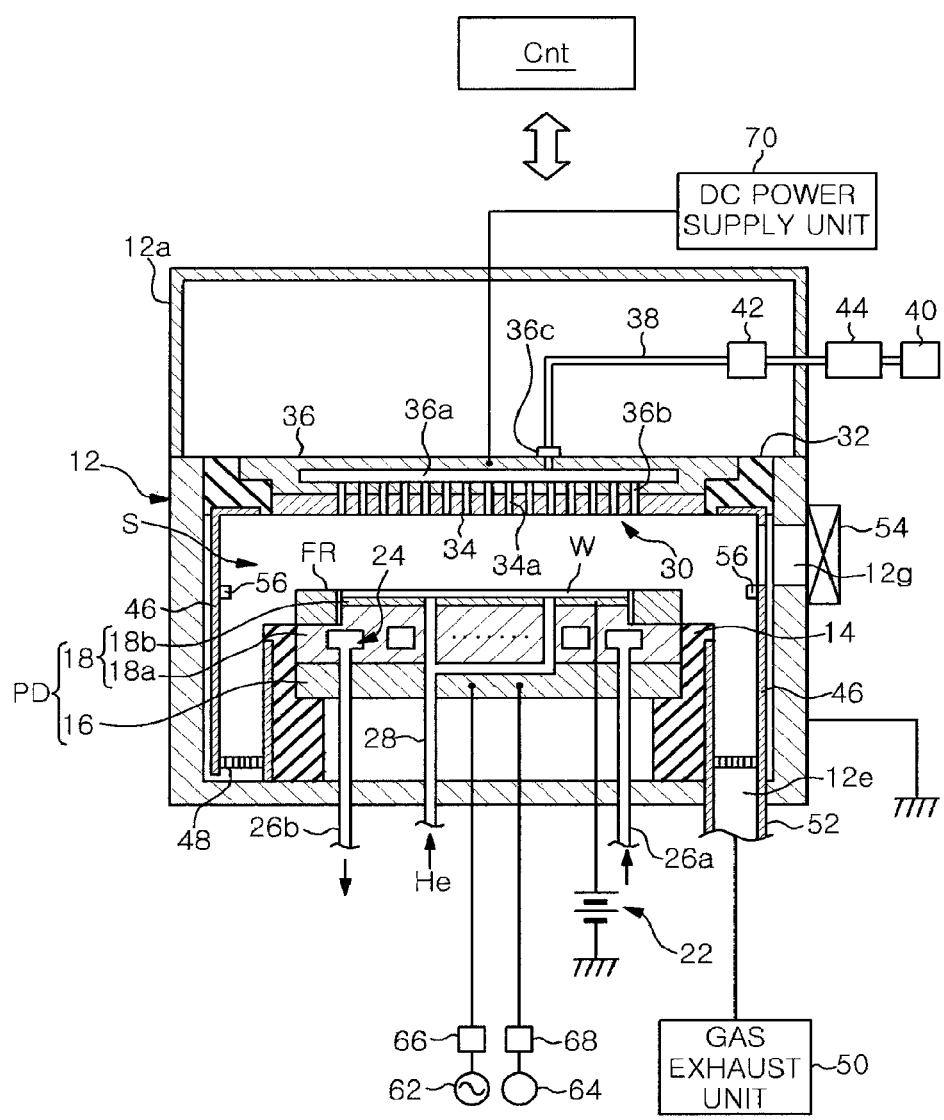
FIG. 3 schematically shows an example of a plasma processing apparatus.

Referring back to FIG. 1, in the step ST1 of the method MT, the wafer W is prepared in a processing chamber of a plasma processing apparatus. In this example, the plasma processing apparatus may be a capacitively coupled plasma processing apparatus. Hereinafter, an example of the plasma processing apparatus that can be used for implementing the method MT will be described. FIG. 3 is a vertical cross sectional view schematically showing a structure of the example of the plasma processing apparatus.

A plasma processing apparatus 10 shown in FIG. 3, which is a capacitively coupled plasma etching apparatus, includes an approximately cylindrical processing chamber 12. The processing chamber 12 has an inner wall surface made of anodically oxidized aluminum. The processing chamber 12 is frame grounded.

An approximately cylindrical support member 14 made of an insulating material is provided on the bottom portion of the processing chamber 12. The support member 14 extends vertically from the bottom portion of the processing chamber 12 inside the processing chamber 12. The support member 14 supports a mounting table PD provided in the processing chamber 12. Specifically, the support member 14 can support the mounting table PD on the inner wall surface thereof, as shown in FIG. 3.

The wafer W is held on the top surface of the mounting table PD. The mounting table PD may include a lower electrode 16 and a support 18. The lower electrode 16 is made of a metal, e.g., aluminum or the like, and has an approximately disk shape. The support 18 is provided on the top surface of the lower electrode 16.

The support 18 for supporting the wafer W includes a base portion 18*a* and an electrostatic chuck 18*b*. The base portion 18*a* is made of a metallic material, e.g., aluminum or the like, and has an approximately disk shape. The base portion 18*a* is installed on the lower electrode 16 and electrically connected to the lower electrode 16. The electrostatic chuck 18*b* is provided on the base portion 18*a*. The electrostatic chuck 18*b* has a structure in which an electrode that is a conductive film is embedded between a pair of insulating layers or insulating sheets. A DC power supply 22 is electrically connected to the electrode of the electrostatic chuck 18*b*. The wafer W can be attracted and held on the electrostatic chuck 18*b* by electrostatic force such as Coulomb force or the like generated by a DC voltage from the DC power supply 22.

A focus ring FR is provided on a peripheral portion of the base portion 18*a* of the support 18 so as to surround the periphery of the wafer W and the electrostatic chuck 18*b*. The focus ring FR is provided to improve etching uniformity. The focus ring FR is made of a material appropriately selected in accordance with a material of an etching target film. For example, the focus ring RF is made of quartz.

A coolant path 24 is formed in the base portion 18*a*. The coolant path 24 forms a temperature control unit in accordance with an embodiment. A coolant of a predetermined temperature is supplied from a chiller unit provided outside through lines 26*a* and 26*b* and circulated in the coolant path 24. A temperature of the wafer W supported on the support 18 is controlled by controlling a temperature of the circulating coolant.

Further, the plasma processing apparatus 10 includes a gas supply line 28. The gas supply line 28 supplies a heat transfer gas, e.g., He gas, from a heat transfer gas supply unit to a gap between the top surface of the electrostatic chuck 18*b* and the backside of the wafer W.

Moreover, the plasma processing apparatus 10 includes an upper electrode 30. The upper electrode 30 is provided above the mounting table PD so as to face the mounting table PD. The lower electrode 16 and the upper electrode 30 are provided in parallel. A processing space S for performing plasma treatment on the wafer W is formed between the upper electrode 30 and the lower electrode 16.

The upper electrode 30 is held at an upper portion of the processing chamber 12 through an insulating shielding member 32. The upper electrode 30 includes an electrode plate 34 and an electrode holder 36. The electrode plate 34 faces the processing space S and has a plurality of gas injection holes 34*a*. The electrode plate 34 may be made of a low-resistance conductor or semiconductor of a low Joule heat.

The electrode holder 36 for detachably holding the electrode plate 34 may be made of a conductive material, e.g., aluminum or the like. The electrode holder 36 may have a water cooling structure. A gas diffusion space 36*a* is provided inside the electrode holder 36. A plurality of gas holes 36*b* communicating with the gas injection holes 34*a* extend downward from the gas diffusion space 36*a*. A gas inlet port 36c for introducing a processing gas into the gas diffusion space 36a is formed at the electrode holder 36. A gas supply line 38 is connected to the gas inlet port 36c.

Figure 4:
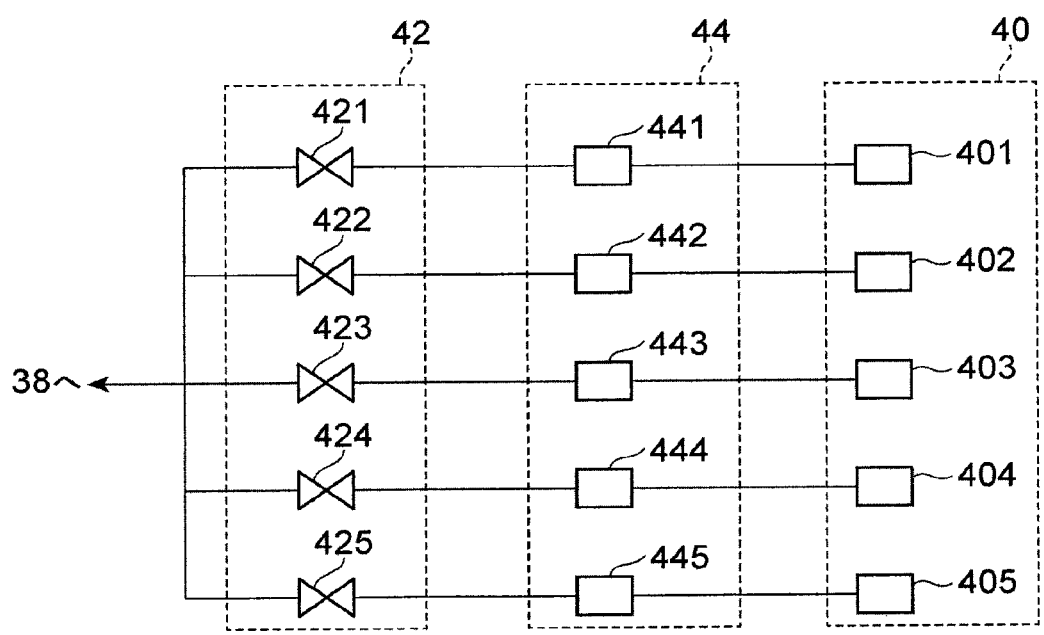
FIG. 4 shows in detail a valve group, a flow rate control group and a gas source group shown in FIG. 3.

A gas source group 40 is connected to the gas supply line 38 via a valve group 42 and a flow rate control group 44. FIG. 4 shows in detail the valve group, the flow rate control group and the gas source group shown in FIG. 3. As shown in FIG. 4, the gas source group 40 has a plurality of (N number of) gas sources 401 to 405. The gas sources 401 to 405 are respectively sources of $H_2$ gas, HBr gas, $NF_3$ gas, $CH_2F_2$ gas, and $CH_4$ gas. Meanwhile, the gas source 401 may be a source of any hydrogen gas. The gas source 403 may be a source of any fluorocarbon-based gas. The fluorocarbon-based gas may be a fluorocarbon gas or a fluorohydrocarbon gas. The fluorocarbon gas includes $C_4F_6$ gas, $C_4F_8$ gas, and $CF_4$ gas. The fluorohydrocarbon gas includes $CH_3F$ gas and $CHF_3$ gas in addition to $CH_2F_2$ gas. The gas source 404 may be a source of any hydrocarbon gas.

The flow rate control group 44 includes a plurality of (N number of) flow rate controllers 441 to 445. The flow rate controllers 441 to 445 control flow rates of gases supplied from the gas sources. The flow rate controllers 441 to 445 may be mass flow controllers (MFC) or may be flow control system (FCS). The valve group 42 includes a plurality of (N number of) valves 421 to 425. The gas sources 401 to 405 are connected to the gas supply line 38 via the flow rate controllers 441 to 445 and the valves 421 to 425, respectively. The gases from the gas sources 401 to 405 reach the gas diffusion space 36a through the gas supply line 38 and are injected to the processing space S through the gas holes 36b and the gas injection holes 34a.

Referring back to FIG. 3, the processing apparatus 10 may further include a ground conductor 12a. The ground conductor 12a has an approximately cylindrical shape and extends upward from the sidewall of the processing chamber to a position higher than the height of the upper electrode 30.

In the plasma processing apparatus 10, a deposit shield 46 is detachably provided along the inner wall of the processing chamber 12. The deposit shield 46 is also provided at an outer periphery of the support 14. The deposit shield 46 for preventing etching by-products (deposits) from being adhered to the processing chamber 12 may be formed by coating an aluminum material with ceramic such as $Y_2O_3$ or the like.

A gas exhaust plate 48 is provided between the support 14 and the inner wall of the processing chamber 12 at the bottom portion of the processing chamber 12. The gas exhaust plate 48 may be formed by coating an aluminum material with ceramic such as $Y_2O_3$ or the like. The processing chamber 12 has a gas exhaust port 12e opened below the gas exhaust plate 48. A gas exhaust unit 50 is connected to the gas exhaust port 12e through a gas exhaust line 52. The gas exhaust unit 50 has a vacuum pump such as a turbo molecular pump or the like, so that a pressure in the processing chamber 12 can be decreased to a desired vacuum level. A loading/unloading port 12g for the wafer W is provided on a sidewall of the processing chamber 12. The loading/unloading port 12g is opened/closed by a gate valve 54.

A conductive member (GND block) 56 is provided on the inner wall of the processing chamber 12. The conductive member 56 is attached to the inner wall of the processing chamber 12 so as to be positioned at the substantially same height as the wafer W. The conductive member 56 is DC-connected to the ground, so that abnormal discharge can be prevented. Meanwhile, the conductive member 56 may be provided at a plasma generation region, and the installation position thereof is not limited to that shown in FIG. 3.

Further, the plasma processing apparatus 10 includes a first and a second RF (Radio Frequency) power supply 62 and 64. The first RF power supply 62 generates first RF power for plasma generation having a frequency of 27 MHz to 100 MHz, e.g., 100 MHz. The first RF power supply 62 is connected to the lower electrode 16 via a matching unit 66. The matching unit 66 is a circuit for matching an output impedance of the first RF power supply 62 with an input impedance of a load side (the lower electrode 16 side). Meanwhile, the first RF power supply 62 may be connected to the upper electrode 30 via the matching unit 66.

The second RF power supply 64 generates a second RF power for ion attraction to the wafer W, i.e., a RF bias power, having a frequency of 400 kHz to 13.56 MHz, e.g., 400 kHz. The second RF power supply 64 is connected to the lower electrode 16 via a matching unit 68. The matching unit 68 is a circuit for matching an output impedance of the second RF power supply 64 with an input impedance of a load side (the lower electrode 16 side).

Moreover, the plasma processing apparatus 10 includes a DC power supply unit 70. The DC power supply unit 70 is connected to the upper electrode 30. The DC power supply unit 70 can generate a negative DC voltage and apply the DC voltage to the upper electrode 30.

In the present embodiment, the plasma processing apparatus 10 may further include a control unit Cnt. The control unit Cnt is a computer including a processor, a storage unit, an input device, a display device and the like, and controls the respective units of the plasma processing apparatus 10. The control unit Cnt can allow an operator to input commands or the like to manage the plasma processing apparatus 10 by using the input device and visualize an operation state of the plasma processing apparatus 10 on the display unit. Further, the storage unit of the control unit Cnt stores therein a control program for controlling various processes performed in the plasma processing apparatus 10 by the processor or a program, i.e., a processing recipe, for performing processes in the respective units of the plasma processing apparatus 10 in accordance with processing conditions.

Specifically, the control unit Cnt transmits control signals to the flow rate controllers 441 to 445, the valves 421 to 425 and the gas exhaust unit 50, and performs control such that the processing gas is supplied into the processing chamber 12 during the etching of the step ST2 and a pressure in the processing chamber 12 becomes a set level.

In the present embodiment, the control unit Cnt can transmit signals for controlling the first and the second RF power supply 62 and 64 to supply RF powers to the electrode 16 while switching ON and OFF of the RF powers in a pulse manner. Further, the control unit Cnt can transmit a signal for controlling the DC power supply 70 to apply, during an RF-power-off period, a negative DC voltage having an absolute value greater than that in an RF-power-on period to the upper electrode 30. Meanwhile, the ON/OFF frequency of the RE power of each of the first and the second RF power supply 62 and 64 is, e.g., 1 kHz to 40 kHz. Here, one cycle of the ON/OFF frequency of the RF power includes the RF-power-on period and the RF-power-off period of each of the first and the second RF power supply 62 and 64. A duty ratio of the RF-power-on period in one cycle is, e.g., 50% to 90%. The switching of the DC voltage of the DC power supply may be synchronized with the ON-OFF switching of the RF powers of the first RF power supply 62 and the second RF power supply 64.

Referring back to FIG. 1, the method MT will be further described. In the step ST1, the wafer W transferred into the processing chamber 12 is mounted on the mounting table PD and attracted and held thereon by the electrostatic chuck 18b. Next, the step ST2 is executed.

In the step ST2, the multilayer film IL is etched. Therefore, in the step ST2, the processing gas from the gas source group 40 is supplied into the processing chamber 12, and a pressure in the processing chamber is set to a predetermined level. The processing gas includes hydrogen gas, HBr gas and $NF_3$ gas, and further includes at least one of hydrocarbon gas, fluorohydrocarbon gas and fluorocarbon gas. For example, the processing gas includes $H_2$ gas, HBr gas, $NF_3$ gas, $CH_4$ gas, and $CH_2F_2$ gas. Further, in the step ST2, the RF power from the first and the second RF power supply 62 and 64 are applied to the lower electrode 16. Various conditions in the step ST2 are set as follows, for example.

$H_2$ gas flow rate: 50 to 300 sccm
HBr gas flow rate: 5 to 50 sccm
$NH_3$ gas flow rate: 50 to 100 sccm
$CH_4$ gas flow rate: 5 to 50 sccm
$CH_2F_2$ gas flow rate: 40 to 80 sccm
Frequency of RF power of first RF power supply 62: 27 to 100 MHz
RF power of first RF power supply 62: 500 to 2700 W
Frequency of RF power of second RF power supply 64: 0.4 to 13 MHz
RF power of second RF power supply 64: 1000 to 4000
Pressure in processing chamber 12: 2.66 to 13.3 Pa (20 to 100 mT)

In the present embodiment, ON and OFF of the RF powers of the first and the second RF power supply 62 and 64 may be switched in a pulse manner. As described above, the absolute value of the DC voltage applied to the upper electrode 30 may be switched in synchronization with the ON-OFF switching of the RF powers of the first and the second RF power supply 62 and 64. In this case, when the RF power is ON, a plasma is generated. When the RF power is OFF, a plasma directly above the wafer W is extinguished. Further, when the RF power is OFF, positive ions are attracted to the upper electrode 30 by the negative DC voltage applied to the upper electrode 30. Accordingly, secondary electrons are emitted from the upper electrode 30. The emitted secondary electrons modify the mask MSK and improve etching resistance of the mask MSK. The secondary electrons neutralize a charged state of the wafer W. As a result, in etching to be performed later, straightness of ions moving into the hole formed in the multilayer film IL is increased. Meanwhile, conditions for switching ON and OFF of the RF powers of the first and the second RF power supply 62 and 64 and conditions of the negative DC voltage applied to the upper electrode 30 are as follows, for example.

Figure 5:
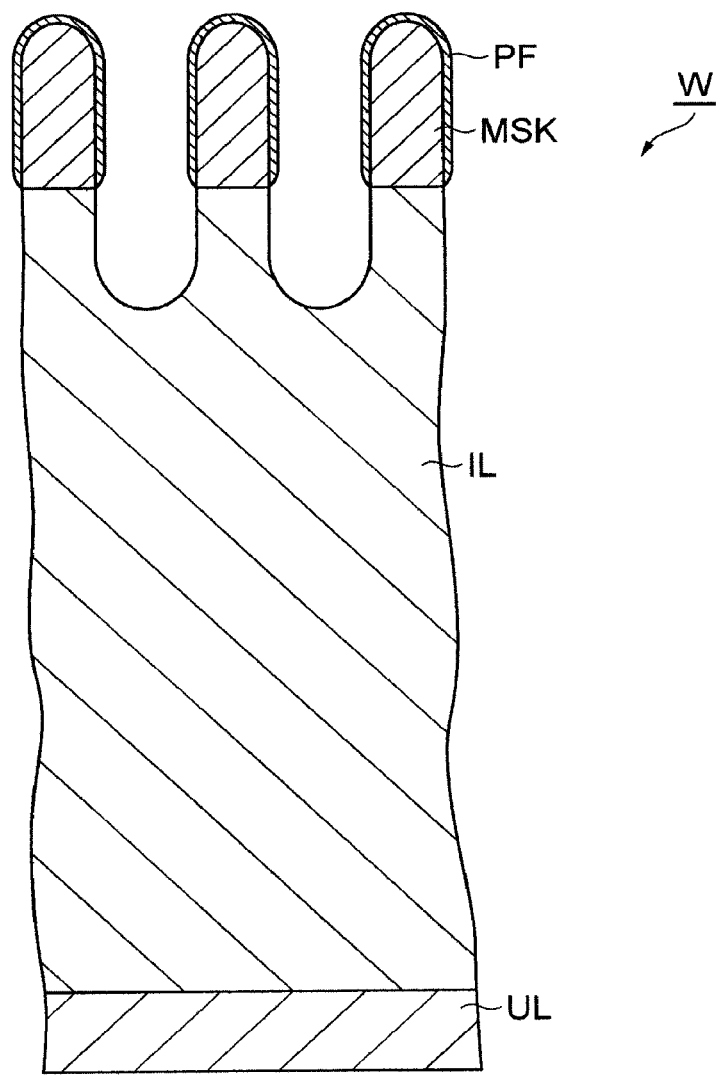
FIG. 5 shows a wafer etched in a step ST2.

ON/OFF frequency of RF power: 1 to 40 kHz
ON duty ratio of RF power during one cycle: 50 to 90%
Absolute value of negative DC voltage in RF-power-on period: 150 to 500 V
Absolute value of negative DC voltage in RF-power-off period: 350 to 1000 V In the step ST2, a plasma of a processing gas is generated in the processing chamber 12. In other words, active species of fluorine, active species of hydrogen and active species of bromide are generated. As shown in FIG. 5, the multilayer film IL is etched below the opening of the mask MSK by the active species. Further, in the step ST2, a protective film PF containing carbon in the processing gas is attached to the surface of the mask MSK. Since the processing gas used in the step ST2 contains a hydrogen-containing gas such as hydrogen gas, HBr gas or the like, the processing gas has a relatively large amount of hydrogen atoms. Accordingly, the protective film PF is modified by the active species of hydrogen, and the hardness of the protective film PF is increased. As a result, the shape of the mask can be maintained until the etching in the step ST2 is completed. In other words, the mask selectivity can be improved in etching for forming a deep hole in the multilayer film IL.

Further, the plasma of the processing gas contains a relatively large amount of active species of hydrogen. Thus, when the dielectric film IL2 is a silicon nitride film, the etching rate of the dielectric film IL2 is increased. As a result, the etching rate of the multilayer film IL is increased.

Furthermore, the plasma of the processing gas contains active species of bromide, so that a film of etching by-products such as SiBrO or the like is formed on the surface defining the hole formed in the multilayer film IL. Accordingly, the surface defining the hole formed in the multilayer film IL becomes smooth.

In the present embodiment, the temperature of the wafer W may be changed during the period of the step ST2. When the temperature of the wafer W is low, the etching rate of the multilayer film IL is increased and, thus, the width of the shape formed in the multilayer film, e.g., the diameter of the hole, is increased. On the other hand, when the temperature of the target object is high, the etching rate of the multilayer film is decreased. However, a thick protective film can be formed. Therefore, a shape having a small width as a whole can be formed, the width being gradually smaller toward a deep portion in a depth direction. Accordingly, it is possible to form a shape, e.g., a hole, having a high verticality and a small width, by changing the temperature of the wafer W during the step (b).

In the step ST2 of a specific example, the temperature of the wafer W in a first period is set to be higher than the temperature of the wafer W in a second period following the first period. In other words, the temperature of the target object is set to a relatively high level in the first period of the step ST2, and the temperature of the target object is set to a relatively low level in the second period of the step ST2. For example, the first period is from the start of the step ST2 to an intermediate point of the step ST2, and the second period is from the intermediate point to the end of the step ST2. The temperature of the wafer W in the first period is, e.g., 30° C., and the temperature of the wafer W in the second period is, e.g., 10° C. In the first period of the step ST2, it is possible to form a shape having a width that becomes gradually smaller toward a bottom in a depth direction and also possible to form a thick protective film on the surface defining the shape such as a hole or the like. Further, in the second period, the width of the shape at the bottom can be increased. Accordingly, a shape, e.g., a hole, having a small width and a high verticality, can be formed.

In the step ST2 of another specific example, the temperature of the wafer W in the first period is set to be lower than the temperature of the wafer W in the second period following the first period. In other words, the temperature of the target object is set to a relatively low level in the first period of the step ST2, and the temperature of the target object is set to a relatively high level in the second period of the step ST2. For example, the temperature of the wafer W in the first period is 10° C., and the temperature of the wafer W in the second period is 30° C. In the step ST2, a high etching rate can be ensured in the first period, and a shape, e.g., a hole, having a small width, can be formed in the second period.

Here, a test example 1 and a comparative example using the plasma processing apparatus 10 will be described. In the test example 1 and the comparative example, there was used a wafer having 12 layers of silicon oxide films and 12 layers of silicon nitride films, a multilayer film IL having a total thickness of 2400 nm, and a hole penetrating through the multilayer film IL. In the test example 1, etching was performed by using a processing gas containing $H_2$ gas, HBr gas, $NF_3$ gas, $CH_2F_2$ gas, and $CH_4$ gas. Meanwhile, in the comparative example, etching was performed by using a processing gas containing $C_4F_6$ gas, $C_4F_8$ gas, $CH_2F_2$ gas, and Ar gas.

As a result, the mask selectivity was 12.6 in the test example 1 and 4.8 in the comparative example. Here, the mask selectivity is a ratio of an etching rate of the multilayer film to an etching rate of the mask. As the mask selectivity is increased, damages inflicted on the mask are decreased, i.e., the shape of the mask is maintained. Further, the etching rate of the multilayer film was 400 nm/min in the test example 1 and 175 nm/min in the comparative example. The results of the test example 1 and the comparative example show that the mask selectivity and the etching rate of the multilayer film are increased by the method MT.

Hereinafter, test examples 2 and 3 using the plasma processing apparatus 10 will be described. In the test example 2, a wafer of the same type as that used in the test example 1 was etched while setting the frequency of the first RF power to 100 MHz and the frequency of the second RF power to 400 kHz. In the test example 3, a wafer of the same type as that used in the test example 1 was etched while setting the frequency of the first RF power to 60 MHz and the frequency of the second RF power to 400 kHz. The other etching conditions in the test examples 2 and 3 were the same as those in the test example 1.

Figure 6A:
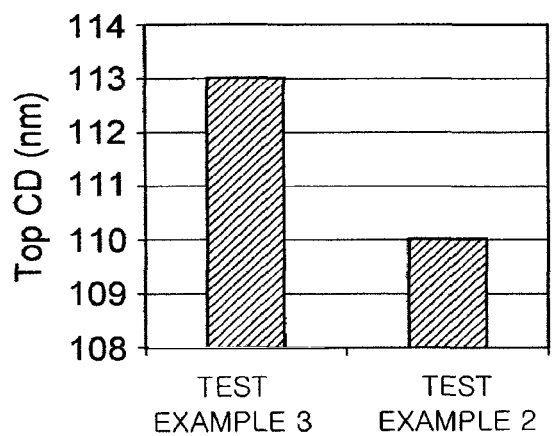
FIGS. 6A to 6C are three graphs showing results of test examples 2 and 3.
Figure 6B:
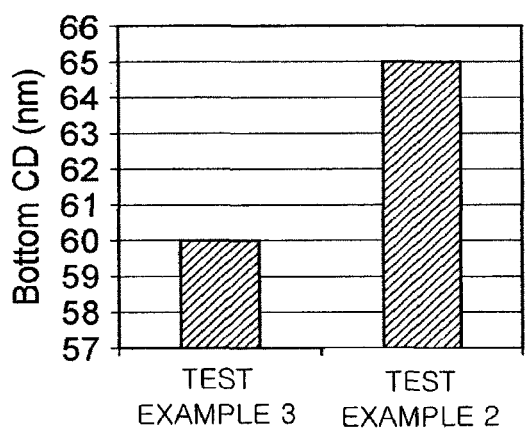
Figure 6C:
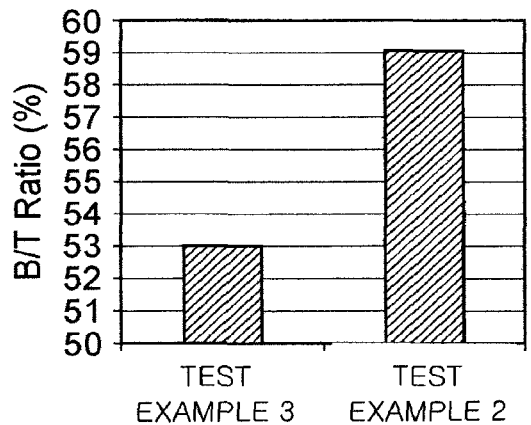

In the test examples 2 and 3, a width of the bottom of a hole formed by etching, a width of the top of the hole, and a ratio of the width of the bottom to the width of the top of the hole were obtained, and the results are shown in FIGS. 6A to 6C. FIG. 6A shows the width, i.e., 'Top CD', of the top of the hole formed by the etching in the test examples 2 and 3. FIG. 6B shows the width, i.e., 'Bottom CD' of the bottom of the hole formed by the etching in the test examples 2 and 3. FIG. 6C shows the ratio, i.e., 'B/T Ratio', of the width of the bottom to the width of the top of the hole formed by the etching in the test examples 2 and 3. As shown in FIG. 6A, the width of the top of the hole was smaller in the test example 2, i.e., in the case where the frequency of the first RF power was set to 100 MHz, than in the test example 3, i.e., in the case where the frequency of the first RF power was set to 60 MHz. As shown in FIG. 6B, the width of the bottom of the hole was greater in the case where the frequency of the first RF power was set to 100 MHz than in the case where the frequency of the first RF power was set to 60 MHz. As shown in FIG. 6C, the ratio of the width of the bottom to the width of the top of the hole was close to 100% in the case where the frequency of the first RF power was set to 100 MHz than in the case where the frequency of the first RF power was set to 60 MHz. From this, it is clear that a hole having a high verticality, i.e., a hole having small variation in a width in a depth direction, can be formed by setting the frequency of the first RF power to a level close to 100 MHz. The reason that the hole having high a vertically is formed by setting the frequency of the first RF power to a level close to 100 MHz is as follows. As the frequency of the first RF power is increased, the plasma density is increased, and this leads to increase in the amount of the protective film and the amount of active species contributing to the etching. As a result, the increase in the width of the top of the hole is suppressed, and the formation of the deep hole is facilitated.

Hereinafter, test examples 4 and 5 using the plasma processing apparatus 10 will be described. In the test example 4, a wafer of the same type as that used in the test example 1 was etched while setting the frequency of the first RE power to 100 MHz and the frequency of the second RF power to 400 kHz. In the test example 5, a wafer of the same type as that used in the test example 1 was etched while setting the frequency of the first RF power to 100 MHz and the frequency of the second RF power to 3.2 MHz. The other conditions in the test examples 4 and 5 are the same as those of the etching in the test example 1. Meanwhile, in the test example 4, the etching was performed three times while setting the first RF power, i.e., 'HF', to 500 W, 1250 W, and 2000 W. In the test example 5, the etching was performed three times while setting 'HF' to 500 W, 1500 W, and 2000 W.

Figure 7A:
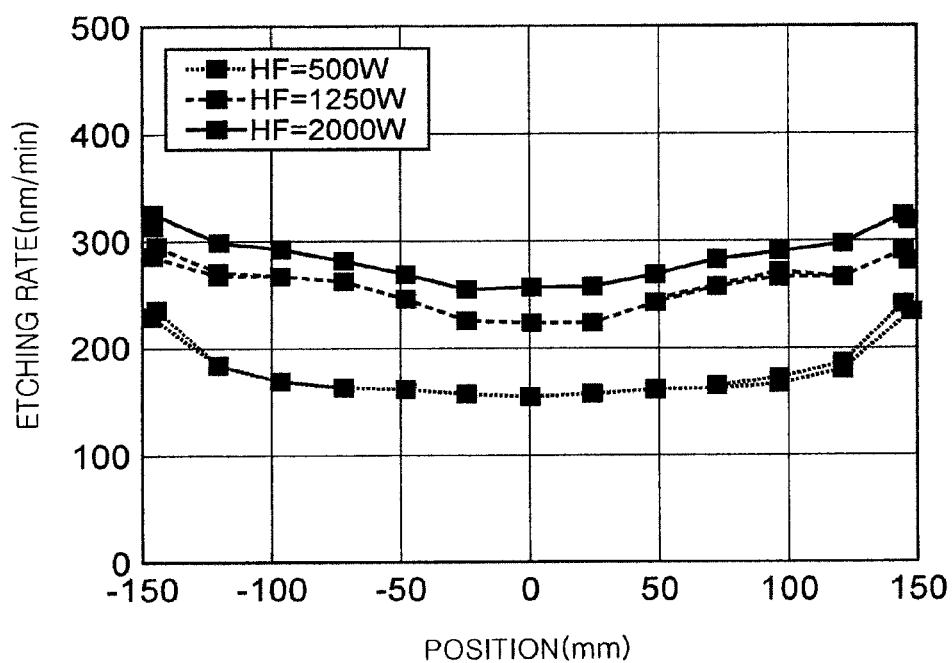
FIGS. 7A and 7B are two graphs showing results of test examples 4 and 5.
Figure 7B:
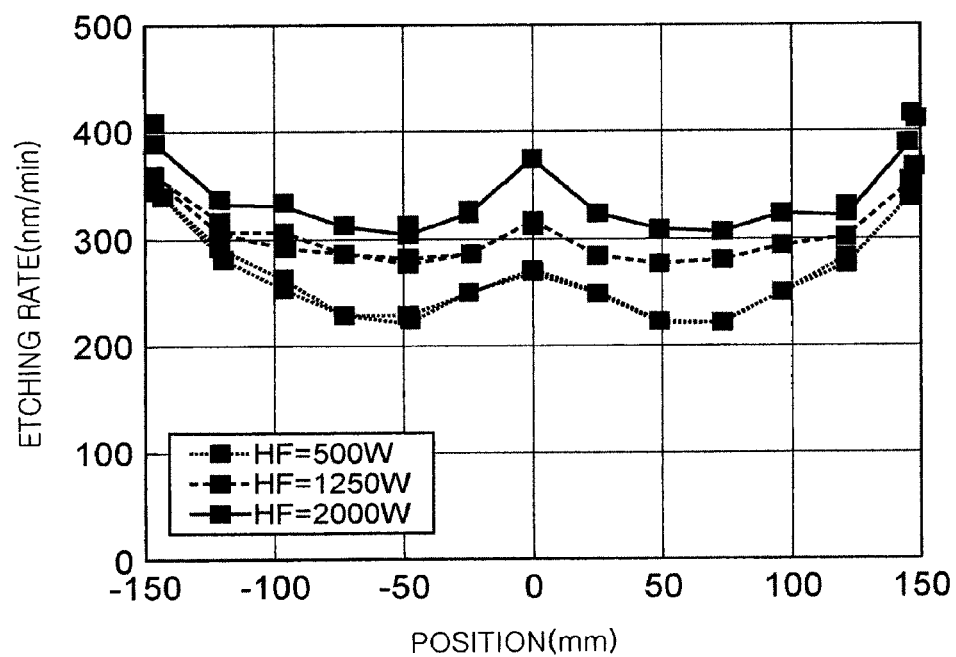

In the test examples 4 and 5, etching rates were obtained, and the results are shown in FIGS. 7A and 7B. FIG. 7A is a graph showing the etching rate obtained in the test example 4. FIG. 7B is a graph showing the etching rate obtained in the test example 5. In the graphs of FIGS. 7A and 7B, the horizontal axis represents a diametrical position on a wafer, and '0' is the central position of the wafer. Further, in the graphs of FIGS. 7A and 7B, the vertical axis represents an etching rate. As shown in FIG. 7B, in the test example 5 in which the frequency of the second RF power was set to 3.2 MHz, the etching rate tended to be increased locally near the center of the wafer. Meanwhile, in the test example 4 in which the frequency of the second RF power was set to 400 kHz, the etching uniformity in the diametrical direction of the wafer was improved. From this, it is clear that the in-plane uniformity of the etching rate can be improved by setting the frequency of the second RF power to a level close to 400 kHz.

Although the embodiments of the present invention have been described, the present invention may be various modified without being limited to the above embodiments. For example, the plasma processing apparatus is not limited to a capacitively coupled plasma processing apparatus, and may be an inductively coupled plasma processing apparatus or a plasma processing apparatus for generating a plasma by introducing a microwave into a processing chamber through a waveguide and an antenna.

While the invention has been shown and described with respect to the embodiments, it will be understood by those skilled in the art that various changes and modifications may be made without departing from the scope of the invention as defined in the following claims.

What is claimed is:

1. A semiconductor device manufacturing method comprising:
    preparing, in a processing chamber of a plasma processing apparatus, a target object including a multilayer film and a mask formed on the multilayer film, the multilayer film being formed by alternately stacking a silicon oxide film and a silicon nitride film;
    etching the silicon oxide film and the silicon nitride film in the multilayer film by supplying a processing gas containing hydrogen gas, nitrogen trifluoride gas and at least one of hydrocarbon gas and fluorohydrocarbon gas into the processing chamber of the plasma processing apparatus and generating a plasma of the processing gas in the processing chamber.

2. The semiconductor device manufacturing method of claim 1, wherein the plasma processing apparatus is a capacitively coupled plasma processing apparatus; and in said etching the multilayer film, an RF power for plasma generation is applied to an upper electrode or a lower electrode of the plasma processing apparatus, and an RF bias power is applied to the lower electrode of the plasma processing apparatus.

3. The semiconductor device manufacturing method of claim 1, wherein the fluorohydrocarbon gas is $CH_2F_2$ gas, $CH_3F$ gas or $CHF_3$ gas.

4. The semiconductor device manufacturing method of claim 1, wherein the hydrocarbon gas is $CH_4$ gas.

5. The semiconductor device manufacturing method of claim 1, wherein the mask is made of amorphous carbon.

6. The semiconductor device manufacturing method of claim 1, wherein a temperature of the target object is changed during said etching the multilayer film.

7. The semiconductor device manufacturing method of claim 6, wherein in said etching the multilayer film, a temperature of the target object in a first period is set to be higher than a temperature of the target object in a second period following the first period.

8. The semiconductor device manufacturing method of claim 6, wherein in said etching the multilayer film, a temperature of the target object in a first period is set to be lower than a temperature of the target object in a second period following the first period.

9. The semiconductor device manufacturing method of claim 1, wherein the etching the silicon oxide film and the silicon nitride film is carried out selective to the mask.

10. The semiconductor device manufacturing method of claim 9, wherein the mask is made of amorphous carbon.

11. The semiconductor device manufacturing method of claim 1, wherein the silicon oxide film and the silicon nitride film in the multilayer film are alternately stacked a plurality of times.

* * * * *